United States Patent [19]

Steinmann et al.

[11] Patent Number: 5,476,748
[45] Date of Patent: Dec. 19, 1995

[54] PHOTOSENSITIVE COMPOSITIONS

[75] Inventors: Bettina Steinmann, Praroman; Jean-Pierre Wolf, Courtaman; Adrian Schulthess, Tentlingen; Max Hunziker, Düdingen, all of Switzerland

[73] Assignee: Ciba-Geigy Corporation, Tarrytown, N.Y.

[21] Appl. No.: 166,767

[22] Filed: Dec. 14, 1993

[30] Foreign Application Priority Data

Dec. 21, 1992 [CH] Switzerland .................... 3906/92

[51] Int. Cl.$^6$ ...................................................... G03C 5/00
[52] U.S. Cl. ........................... 430/269; 430/280; 522/162; 522/170
[58] Field of Search ................................. 430/280, 269; 522/162, 170

[56] References Cited

U.S. PATENT DOCUMENTS 4,575,330  3/1986  Hull ........................ 425/174.4

FOREIGN PATENT DOCUMENTS

| 0118044 | 9/1984 | European Pat. Off. . |
| 0144148 | 6/1985 | European Pat. Off. . |
| 0222582 | 5/1987 | European Pat. Off. . |
| 0320237 | 6/1989 | European Pat. Off. . |
| 0360869 | 4/1990 | European Pat. Off. . |
| 0517657 | 12/1992 | European Pat. Off. . |
| 1183434 | 3/1970 | United Kingdom . |

OTHER PUBLICATIONS

Derw. Abst. 92–409086/50.
Derwent Abstract 90–127832/17.
Chemical Abstract 113:173474n.

*Primary Examiner*—Marion E. McCamish
*Attorney, Agent, or Firm*—William A. Teoli, Jr.

[57] ABSTRACT

The invention relates to photosensitive compositions comprising

A) from 40 to 80% by weight of at least one liquid epoxy resin having an epoxy functionality of equal to or greater than 2, B) from 0.1 to 10% by weight of at least one cationic photoinitiator for component A), C) from 5 to 40% by weight of at least one liquid cycloaliphatic or aromatic diacrylate, D) from 0 to 15% by weight of at least one liquid poly(meth-)acrylate having a (meth-)acrylate functionality of greater than 2, the proportion of component D) constituting a maximum of 50% by weight of the total (meth-)acrylate content, E) from 0.1 to 10% by weight of at least one radical photoinitiator for component C) and, where appropriate, D) and F) from 5 to 40% by weight of at least one OH-terminated polyether, polyester or polyurethane, which are especially suitable, for example, for the manufacture of photopolymerized layers, especially of three-dimensional objects.

22 Claims, No Drawings

PHOTOSENSITIVE COMPOSITIONS

The present invention relates to photosensitive compositions, to a process for the polymerisation of those compositions by means of actinic irradiation, and to the use of those compositions in the manufacture of photopolymerised layers, especially of three-dimensional objects that are made up of several photopolymerised layers.

As is known, radiation-sensitive, liquid resins or resin mixtures are very versatile; for example, they can be used as coating compositions, adhesives or photoresists. In principle, liquid resins or resin systems should in general be suitable also for the manufacture of three-dimensional objects (3D objects) in accordance with the stereolithographic process described in U.S. Pat. No. 4,575,330, but many resins prove to be too viscous and others again, after photocuring, do not quite satisfy the high requirements in respect of dimensional accuracy which are nowadays made of the objects or shaped articles so manufactured.

As is known, a stereolithographic process can be used to manufacture complicated three-dimensional objects from liquid, photosensitive resins. Such objects are built up in layers, each new curable resin layer being firmly bonded to the previous, pre-cured layer by precuring using UV/VIS light. It is known that the overall structure of the three-dimensional object can be produced by a computer-controlled process. In that process of consecutive polymerisation of thin layers, none of those layers is generally fully cured. The incompletely cured object is known as a green model and the modulus of elasticity and the flexural strength of that green model is also referred to as the green strength. The green model is normally then cured with UV/VIS light, for example by means of a mercury or xenon arc lamp. The green strength of a workpiece accordingly constitutes an important parameter because objects having a low green strength can become deformed under their own weight, or they may sag or collapse during curing.

A criterion also known in stereolithography is the so-called curl factor. The curl factor is used to characterize shrinkage phenomena of the objects or shaped articles manufactured from the resin systems used. The determination of the curl factors is described, for example, in "Proceedings $2^{nd}$ Int. Conference in Rapid Prototyping", Dayton, Ohio (1991).

In recent years there has been no shortage of efforts to develop resin systems that can be used for the stereolithographic process. JP Kokai 02 75,618 discloses mixtures consisting of an epoxy resin, an acrylate, a cationic and a radical photoinitiator, and also an OH-terminated polyester. The acrylate component used comprises at least 50% of an acrylate monomer having more than 3 double bonds.

EP-A 360 869 discloses a resin mixture for shaping by means of light that comprises a radiation-curable and cationically polymerisable organic compound and a cationic photoinitiator, the concomitant use of other radical-polymerisable components, for example polyacrylates, also being possible, where appropriate.

It has now been found that radiation-sensitive epoxy-acrylate hybrid systems that additionally comprise a polyol, an OH-terminated polyester or an OH-terminated polyurethane can be used for stereolithographic processes. Those resin systems are distinguished by a very low viscosity, a very low curl factor and good mechanical properties in the green state and after full curing.

The present invention accordingly relates to a photosensitive composition comprising A) from 40 to 80% by weight of at least one liquid epoxy resin having an epoxy functionality of equal to or greater than 2, B) from 0.1 to 10% by weight of at least one cationic photoinitiator for component A), C) from 5 to 40% by weight of at least one liquid cycloaliphatic or aromatic diacrylate, D) from 0 to 15% by weight of at least one liquid poly(meth-)acrylate having a (meth-)acrylate functionality of greater than 2, the proportion of component D) constituting a maximum of 50% by weight of the total (meth-)acrylate content, E) from 0.1 to 10% by weight of at least one radical photoinitiator for component C) and, where appropriate, component D) and F) from 5 to 40% by weight of at least one OH-terminated polyether, polyester or polyurethane.

The percentages by weight for the above components A) to F) are to be understood as indicating that the sum of all the components used is always 100% by weight.

Preferred are compositions in which the proportion of component D) constitutes a maximum of 40% by weight of the total (meth)acrylate content.

The photosensitive compositions preferably comprise

A) from 50 to 75% by weight of at least one liquid epoxy resin having an epoxy functionality of equal to or greater than 2, B) from 0.2 to 5% by weight of at least one cationic photoinitiator for component A), C) from 5 to 20% by weight of at least one liquid cycloaliphatic or aromatic diacrylate, D) from 0 to 10% by weight of at least one liquid polyacrylate having an acrylate functionality of greater than 2, the proportion of component D) constituting a maximum of 50% by weight of the total acrylate content, E) from 0.2 to 5% by weight of at least one radical photoinitiator for component C) and, where appropriate, component D) and F) from 10 to 40% by weight of at least one OH-terminated polyether, polyester or polyurethane.

The liquid epoxy resins that are used in the compositions according to the invention are compounds that possess on average more than one 1,2-epoxy group in the molecule.

Such resins may have an aliphatic, aromatic, cycloaliphatic, araliphatic or heterocyclic structure; they comprise epoxy groups as side groups, or those groups form part of an alicyclic or heterocyclic ring system. Epoxy resins of those types are generally known and are commercially available.

There may be mentioned as examples of epoxy resins of that type:

I) Polyglycidyl and poly(β-methylglycidyl) esters obtainable by the reaction of a compound having at least two carboxy groups in the molecule and epichlorohydrin or glycerol dichlorohydrin or β-methyl-epichlorohydrin. The reaction is advantageously effected in the presence of bases.

Aliphatic polycarboxylic acids can be used as compounds having at least two carboxy groups in the molecule. Examples of those polycarboxylic acids are glutaric acid, adipic acid, pimelic acid, suberic acid, azelaic acid, sebacic acid or dimerised or dimerised linoleic acid.

It is, however, also possible to use cycloaliphatic polycarboxylic acids, such as, for example, tetrahydrophthalic acid, 4-methyltetrahydrophthalic acid, hexahyctrophthalic acid or 4-methylhexahydrophthalic acid.

It is also possible to use aromatic polycarboxylic acids, such as, for example, phthalic acid, isophthalic acid, trimellitic acid or pyromellitic acid.

It is likewise possible to use carboxy-terminated adducts, for example of trimellitic acid and polyols, such as, for example, glycerol or 2,2-bis(4-hydroxycyclohexyl)propane.

II) Polyglycidyl or poly(β-methylglycidyl) ethers obtainable by the reaction of a compound having at least two free alcoholic hydroxy groups and/or phenolic hydroxy groups and a suitably substituted epichlorohydrin under alkaline conditions, or in the presence of an acidic catalyst with subsequent alkali treatment.

Ethers of that type are derived, for example, from acyclic alcohols, such as ethylene glycol, diethylene glycol and higher poly(oxyethylene) glycols, propane-1,2-diol, or poly(oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and also from polyepichlorohydrins.

They are, however, also derived, for example, from cycloaliphatic alcohols, such as 1,3- or 1,4-dihydroxycyclohexane, bis(4-hydroxycyclohexyl)methane, 2,2-bis(4-hydroxycyclohexyl)propane or 1,1-bis(hydroxymethyl)cyclohex-3-ene, or they possess aromatic nuclei, such as N,N-bis(2-hydroxyethyl)aniline or p,p'-bis(2-hydroxyethylamino)diphenylmethane.

The epoxy compounds may also be derived from mononuclear phenols, such as, for example, from resorcinol or hydroquinone, or they are based on polynuclear phenols, such as, for example, bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolaks and cresol novolaks.

III) Poly(N-glycidyl) compounds are, for example, obtainable by dehydrochlorination of the reaction products of epichlorohydrin with amines that comprise at least two amine hydrogen atoms. Those amines are, for example, n-butylamine, aniline, toluidine, m-xylylenediamine, bis(4-aminophenyl)methane or bis(4-methylaminophenyl)methane.

The poly(N-glycidyl) compounds also include, however, N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

IV) Examples of poly(S-glycidyl) compounds are di-S-glycidyl derivatives which are derived from dithiols, such as, for example, ethane-1,2-dithiol or bis(4-mercaptomethylphenyl) ether.

V) Examples of epoxy compounds in which the epoxy groups form part of an alicyclic or heterocyclid ring system are bis(2,3-epoxycyclopentyl) ether, 2,3-epoxycyclopentyl glycidyl ether, 1,2-bis(2,3-epoxycyclopentyloxy)ethane, bis(4-hydroxycyclohexyl)methane diglycidyl ether, 2,2-bis(4-hydroxycyclohexyl)propane diglycidyl ether, 3,4-epoxycyclo-hexylmethyl- 3,4-epoxycyclohexane 3,4-epoxy-6-methyl-cyclohexylmethyl-3,4-epoxy-6-methylcyclohexanecarboxylate, di-(3,4-epoxycyclohexylmethyl)hexanedioate, di-(3,4-epoxy-6-methyl-cyclohexylmethyl)hexanedioate, ethylenebis(3,4-epoxycyclohexanecarboxylate), ethanedioldi-(3,4-epoxycyclohexylmethyl) ether, vinylcyclohexene dioxide, dicyclopentadiene diepoxide or 2-(3,4-epoxycyclohexyl-5,5-spiro-3,4-epoxy)cyclohexane-1,3-dioxane.

It is, however, also possible to use epoxy resins in which the 1,2-epoxy groups are bonded to different hetero atoms or functional groups. Those compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane.

In addition, liquid pre-reacted adducts of such epoxy resins with hardeners are suitable for epoxy resins.

It is of course also possible to use mixtures of epoxy resins in the compositions according to the invention.

Preferred are compositions wherein component A) comprises at least 50% by weight of a cycloaliphatic diepoxide. Especially preferred are compositions wherein the cycloaliphatic diepoxide is bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexanecarboxylate, 3,4-epoxy-6-methyl-cyclohexylmethyl-3,4-epoxy-6-methylcyclohexanecarboxylate, di-(3,4-epoxycyclohexylmethyl)hexanedioate, di-(3,4-epoxy-6-methyl-cyclohexylmethyl)hexanedioate, ethylenebis(3,4-epoxycyclohexanecarboxylate), ethanediol di-(3,4-epoxycyclohexylmethyl) ether or 2-(3,4-epoxycyclohexyl-5,5-spiro-3,4-epoxy)cyclohexane-1,3-dioxane.

There may be used as component B) of the compositions according to the invention a large number of known and technically proven cationic photoinitiators for epoxy resins. They are, for example, onium salts with anions of weak nucleophilicity. Examples are halonium salts, iodosyl salts or sulfonium salts, such as are described in EP-A 153 904, sulfoxonium salts, such as described, for example, in EP-A 35 969, 44 274, 54 509 and 164 314, or diazonium salts, such as described, for example, in U.S. Pat. No. 3,708,296. Other cationic photoinitiators are metallocene salts, such as described, for example, in EP-A 94 914 and 94 915.

A survey of other current onium salt initiators and/or metallocene salts can be found in "UV-Curing, Science and Technology", (Editor: S. P. Pappas, Technology Marketing Corp., 642 Westover Road, Stanford, Conn., U.S.A.) or "Chemistry & Technology of UV & EB Formulation for Coatings, Inks & Paints", Vol. 3 (edited by P. K. T. Oldring).

Preferred are compositions comprising as component B) a compound of formula I, II or III

$$[R_1-I-R_2]^{\oplus}[LQ_m]^{\ominus}, \quad (I)$$

$$\left[\begin{array}{c} O \\ \| \\ R_3-I-R_4 \end{array}\right]^{\oplus} [LQ_m]^{\ominus}, \quad (II)$$

$$\left[\begin{array}{c} R_5 \\ \diagdown \\ \phantom{x}S-R_7 \\ \diagup \\ R_6 \end{array}\right]^{\oplus} [LQ_m]^{\ominus}, \quad (III)$$

wherein $R_1$, $R_2$, $R_3$, $R_4$, $R_5$, $R_6$ and $R_7$ are each independently of the others $C_6$–$C_{18}$ aryl that is unsubstituted or substituted by suitable radicals, L is boron, phosphorus, arsenic or antimony, Q is a halogen atom or some of the radicals Q in an anion $LQ_m^-$ may also be hydroxy groups, and m is an integer that corresponds to the valency of L plus 1.

Examples of $C_6$–$C_{18}$aryl are phenyl, naphthyl, anthryl and phenanthryl. Any substituents present for suitable radicals are alkyl, preferably $C_1$–$C_6$alkyl, such as methyl, ethyl, n-propyl, isopropyl, n-butyl, sec-butyl, isobutyl, tert-butyl or the various pentyl or hexyl isomers, alkoxy, preferably $C_1$–$C_6$alkoxy, such as methoxy, ethoxy, propoxy, butoxy, pentyloxy or hexyloxy, alkylthio, preferably $C_1$–$C_6$alkylthio, such as methylthio, ethylthio, propylthio, butylthio, pentylthio or hexylthio, halogen, such as fluorine, chlorine, bromine or iodine, amino groups, cyano groups, nitro groups or arylthio, such as phenylthio.

Examples of preferred halogen atoms Q are chlorine and especially fluorine. Preferred anions $LQ_m^-$ are $BF_4^-$, $PF_6^-$, $AsF_6^-$, $SbF_6^-$ and $SbF_5(OH)^-$.

Especially preferred are compositions comprising as component B) a compound of formula III wherein $R_5$, $R_6$ and $R_7$ are aryl, aryl being especially phenyl or biphenyl or mixtures of those two compounds.

Also preferred are compositions comprising as component B) a compound of formula IV $$[R_8(Fe^{II}R_9)_c]_d^{+c} [X]_c^{-d}, \quad (IV)$$

wherein c is 1 or 2, d is 1,2,3,4 or 5,

X is a non-nucleophilic anion, especially $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, n-$C_6F_{13}SO_3^-$ or n-$C_8F_{17}SO_3^-$, $R_8$ is a π-arene and $R_9$ is an anion of a π-arene, especially a cyclopentadienyl anion.

Examples of π-arenes as $R_8$ and anions of π-arenes as $R_9$ are to be found in EP-A 94 915.

Examples of preferred π-arenes as $R_8$ are toluene, xylene, ethylbenzene, cumene, methoxybenzene, methylnaphthalene, pyrene, perylene, stilbene, diphenylene oxide and diphenylene sulfide.

Especially preferred are cumene, methylnaphthalene or stilbene.

Examples of non-nucleophilic anions $X^-$ are $FSO_3^-$, anions of organic sulfonic acids, of carboxylic acids or anions $LQ_m^-$, as already defined above.

Preferred anions are derived from partially fluoro- or perfluoro-aliphatic or partially fluoro- or perfluoro-aromatic carboxylic acids, or especially from partially fluoro- or per-fluoro-aliphatic or partially fluoro- or perfluoro-aromatic organic sulfonic acids, or they are preferably anions $LQ_m^-$.

Examples of anions X are $BF_4^-$, $PF_6^-$, $AsF_6^-$, $SbF_6^-$, $SbF_5(OH)^-$, $CF_3SO_3^-$, $C_2F_5SO_3^-$, n-$C_3F_7SO_3^-$, n-$C_4F_9SO_3^-$, n-$C_6F_{13}SO_3^-$, n-$C_8F_{17}SO_3^-$, $C_6F_5SO_3^-$, phosphorus tungstable ($PO_{40}W_{12}^{3-}$) or silicon tungstate ($SiO_{40}W_{12}^{4-}$).

Preferred are $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, n-$C_6F_{13}SO_3^-$ and n-$C_8F_{17}SO_3^-$.

The metallocene salts can also be used in combination with oxidising agents. Such combinations are described in EP-A 126 712.

In order to increase the light efficiency, it is also possible, depending on the type of initiator, to use sensitisers. Examples are polycyclic aromatic hydrocarbons or aromatic keto compounds. Specific examples of preferred sensitisers are mentioned in EP-A 153 904.

Suitable as component C) are, for example, the diacrylates of cycloaliphatic or aromatic diols, such as 1,4-dihydroxymethylcyclohexane, 2,2-bis(4-hydroxycyclohexyl)propane, bis(4-hydroxycyclohexyl)methane, hydroquinone, 4,4'-dihydroxybiphenyl, bisphenol A, bisphenol F, bisphenol S, ethoxylated or propoxylated bisphenol A, ethoxylated or propoxylated bisphenol F or ethoxylated or propoxylated bisphenol S. Such diacrylates are known and some of them are commercially available.

Preferred are compositions comprising as component C) a compound of formula V, VI, VII or VIII

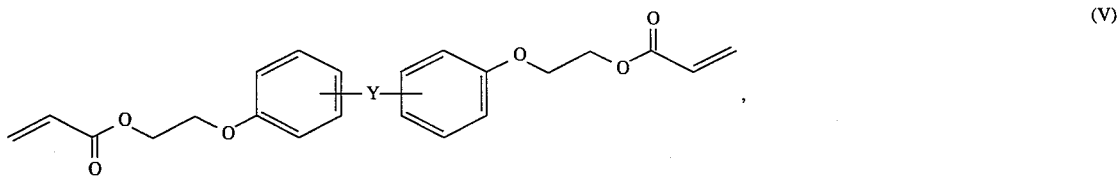
(V)

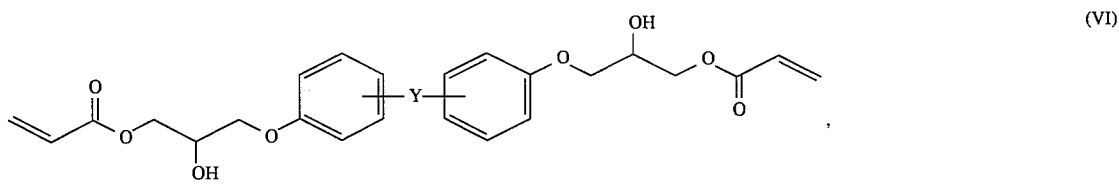
(VI)

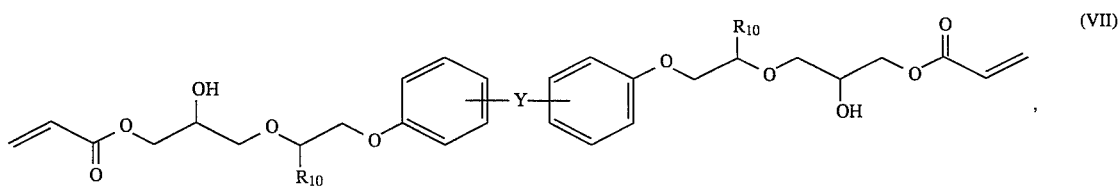
(VII)

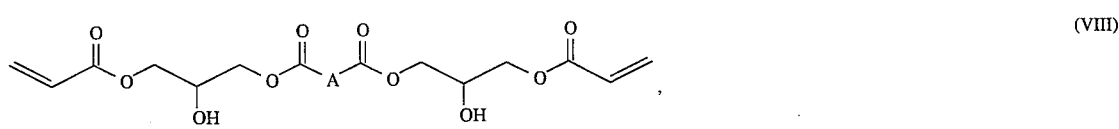
(VIII)

wherein

Y is a direct bond, $C_1$–$C_6$alkylene, —S—, —O—, —SO—, —$SO_2$— or —CO—, $R_{10}$ is a $C_1$–$C_8$alkyl group, a phenyl group that is unsubstituted or substituted by one or more $C_1$–$C_4$alkyl groups, hydroxy groups or halogen atoms, or a radical of the formula —$CH_2$—$OR_{11}$, wherein $R_{11}$ is a $C_1$–$C_8$alkyl group or a phenyl group, and A is a radical of the formula

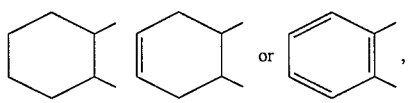

or comprising as component C) a compound of any one of formulae IXa to IXd

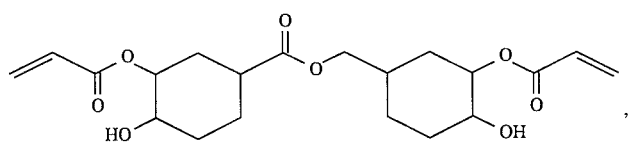

(IXa)

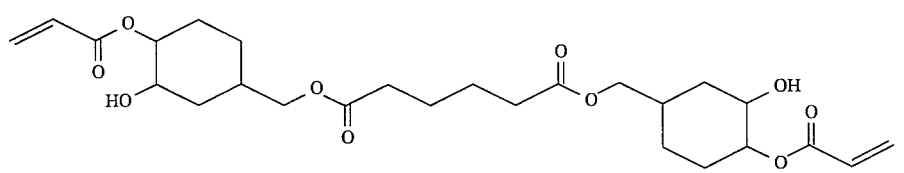

(IXb)

and the corresponding isomers,

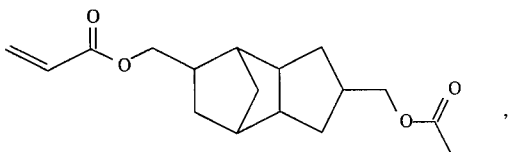

(IXc)

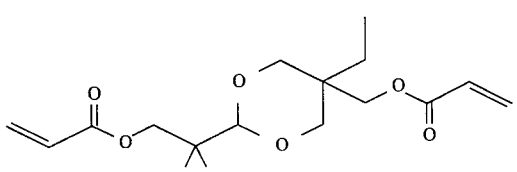

(IXd)

If a substituent is $C_1$–$C_4$alkyl or $C_1$–$C_8$alkyl, it may be straight-chained or branched. $C_1$–$C_4$alkyl may be, for example, methyl, ethyl, n-propyl, isopropyl, n-butyl, sec-butyl, isobutyl or tert-butyl, and $C_1$–$C_8$alkyl may additionally be, for example, the various pentyl, hexyl, heptyl or octyl isomers.

If a substituent is halogen, it is fluorine, chlorine, bromine or iodine, but especially chlorine or bromine.

If a substituent is $C_1$–$C_6$alkylene it is, for example, methylene, ethylene, propylene (methylethylene), trimethylene, 1,1-propanediyl, 2,2-propanediyl, tetramethylene, ethylmethylene, 1,1-butanediyl, 2,2-butanediyl, pentamethylene or hexamethylene. The alkylene radicals may also be substituted by halogen atoms. Examples of halogenated alkylene radicals are —$C(CCl_3)_2$— and —$C(CF_3)_2$—.

Especially preferred in the compositions are compounds of the formula V, VI or VII wherein Y is —$CH_2$— or —$C(CH_3)_2$—.

Also especially preferred are compounds of formula VII wherein $R_{10}$ is n-butyl, phenyl, n-butoxymethyl or phenoxymethyl.

The liquid poly(meth-)acrylates having a (meth-)acrylate functionality of greater than 2 which may, where appropriate, be used as component D) in the compositions according to the invention may, for example, be tri-, tetra- or penta-functional monomeric or oligomeric aliphatic, cycloaliphatic or aromatic acrylates or methacrylates.

Suitable as aliphatic polyfunctional (meth-)acrylates are, for example, the triacrylates and trimethacrylates of hexane-2,4,6-triol, glycerol or 1,1,1-trimethylolpropane, ethoxylated or propoxylated glycerol or 1,1,1-trimethylolpropane and the hydroxy group-containing tri(meth-)acrylates which are obtained by the reaction of triepoxy compounds, such as, for example, the triglycidyl ethers of the mentioned triols, with (meth-)acrylic acid. It is also possible to use, for example, pentaerythritol tetraacrylate, bistrimethylolpropane tetraacrylate, pentaerythritol monohydroxytri-acrylate or -methacrylate or dipentaerythritol monohydroxypenta-acrylate or -methacrylate.

It is also possible to use hexafunctional urethane acrylates or urethane methacrylates. Those urethane (meth-)acrylates are known to the person skilled in the art and can be prepared in known manner, for example by reacting a hydroxy-terminated polyurethane with acrylic acid or methacrylic acid, or by reacting an isocyanate-terminated prepolymer with hydroxyalkyl (meth-)acrylates to form the urethane (meth-)acrylate.

Suitable as aromatic tri(meth-)acrylates are, for example, the reaction products of triglycidyl ethers of trihydric phenols, and phenol or cresol novolaks having three hydroxy groups with (meth)-acrylic acid.

The (meth-)acrylates used as component D) are known compounds and some are commercially available, for example from SARTOMER Company and UCB.

Compositions wherein component D) is a tri(meth-)acrylate or a penta(meth-)acrylate are preferred.

Compositions wherein component D) is dipentaerythritol monohydroxypenta(meth-)acrylate are especially preferred.

In the compositions according to the invention, any type of photoinitiator that forms free radicals when the appropriate irradiation takes place can be used as component E). Typical compounds of known photoinitiators are benzoins, such as benzoin, benzoin ethers, such as benzoin methyl ether, benzoin ethyl ether and benzoin isopropyl ether, benzoin phenyl ether and benzoin acetate, acetophenones, such as acetophenone, 2,2-dimethoxyacetophenone and 1,1-dichloroacetophenone, benzil, benzil ketals, such as benzil dimethyl ketal and benzil diethyl ketal, anthraquinones, such as 2-methylanthraquinone, 2-ethylanthraquinone, 2-tert-butylanthraquinone, 1-chloroanthraquinone and 2-amylanthraquinone, also triphenylphosphine, benzoylphosphine oxides, such as, for example, 2,4,6-trimethylbenzoyldiphenylphosphine oxide (Luzirin® TPO), benzophenones, such as benzophenone and 4,4'-bis(N,N'-dimethylamino)benzophenone, thioxanthones and xanthones, acridine derivatives, phenazine derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl) ketone and 4-isopropylphenyl (1-hydroxyisopropyl) ketone, all of which are known compounds.

Especially suitable photoinitiators, which are normally used in combination with a He/Cd laser as the light source, are acetophenones, such as 2,2-dialkoxybenzophenones and 1-hydroxyphenyl ketones, for example 1-hydroxycyclohexyl phenyl ketone or 2-hydroxyisopropyl phenyl ketone (=2-hydroxy-2,2-dimethylacetophenone), but especially 1-hydroxycyclohexyl phenyl ketone.

Another class of photoinitiators E), which are normally employed when argon-ion lasers are used, comprises the benzil ketals, such as, for example, benzil dimethyl ketal. Especially an α-hydroxyphenyl ketone, benzil dimethyl ketal or 2,4,6-trimethylbenzoyldiphenylphosphine oxide is used as photoinitiator.

Another class of suitable photoinitiators E) comprises the ionic dye-counter ion compounds which are capable of absorbing actinic rays and producing free radicals which can initiate the polymerisation of the acrylates. The compositions according to the invention that comprise ionic dye-counter ion compounds can thus be cured in a more variable manner using visible light in an adjustable wavelength range of from 400 to 700 nm. Ionic dye-counter ion compounds and their mode of action are known, for example from EP-A 223 587 and U.S. Pat. Nos. 4,751,102, 4,772,530 and 4,772,541. There may be mentioned as examples of suitable ionic dye-counter ion compounds the anionic dye-iodonium ion complexes, the anionic dye-pyryllium ion complexes and, especially, the cationic dye-borate anion compounds of the following formula

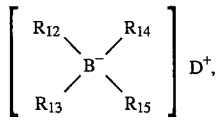

wherein $D^+$ is a cationic dye and $R_{12}$, $R_{13}$, $R_{14}$ and $R_{15}$ are each independently of the others alkyl, aryl, alkaryl, allyl, aralkyl, alkenyl, alkynyl, an alicyclic or saturated or unsaturated heterocyclic group. Preferred definitions for the radicals $R_{12}$ to $R_{15}$ can be found, for example, in EP-A 223 587.

As is known, the photoinitiators are added in effective amounts, that is to say, in amounts of from 0.1 to 10% by weight, calculated on the total amount of the composition. If the compositions according to the invention are used for stereolithographic processes, in which laser beams are normally used, it is important that the absorption capacity of the composition is so adjusted by the type and concentration of the photoinitiators that the depth of cure at normal laser speed is approximately from 0.1 to 2.5 mm.

Preferably, the compositions according to the invention comprise as photoinitiator E) a 1-hydroxyphenyl ketone, especially 1-hydroxycyclohexyl phenyl ketone.

The OH-terminated polyethers, polyesters or polyurethanes used as component F) are known to the person skilled in the art and some of them are commercially available, such as, for example, TONE® Polyol 0301 manufactured by Union Carbide or Desmophen® 1600 and Desmophen® 1915 manufactured by Bayer AG. Compositions comprising a linear or branched polyester polyol as component F) are preferred.

Compositions comprising a trifunctional OH-terminated polycaprolactone as component F) are likewise preferred.

Especially preferred are photosensitive compositions comprising as component A) a cycloaliphatic diepoxide and an aliphatic polyglycidyl ether, as component B) triarylsulfonium hexafluoroantimonate, as component C) a compound of formula VI wherein Y is —CH$_2$— or —C(CH$_3$)$_2$—, as component D) a tri(meth-)acrylate or a penta(meth-)acrylate, as component E) a 1-hydroxyphenyl ketone and as component F) a linear or branched polyester polyol.

If desired, it is possible to add to the compositions according to the invention the customary additives G), for example stabilisers, such as UV stabilisers, polymerisation inhibitors, release agents, wetting agents, levelling agents, sensitisers, anti-settling agents, surface-active agents, dyes, pigments or fillers.

The compositions according to the invention can be prepared in known manner, for example by pre-mixing individual components and subsequently mixing those pre-mixtures or by mixing all of the components by means of customary apparatuses, such as impeller-type mixers, advantageously in the absence of light and, where appropriate, at slightly elevated temperature.

The photosensitive compositions according to the invention can be polymerised by irradiation with actinic light, for example by means of electron beams, X-rays, UV or VIS light, that is to say, with electromagnetic radiation or particle radiation in the wavelength range of from 280 to 650 nm. Especially suitable are laser beams of He/Cd, argon or nitrogen, and metal vapour and NdYAG lasers with multiplied frequency. It is known to the person skilled in the art that suitable photoinitiators must be selected and, where appropriate, sensitised for each light source chosen. It has been recognised that the depth of penetration of the radiation into the composition to be polymerised and the operating speed are directly linked with the absorption coefficients and the concentration of the photoinitiators.

The compositions according to the invention may also comprise various photoinitiators having different radiation sensitivities to the rays of emission lines of different wavelengths. A better utilisation of a UV/VIS light source that radiates emission lines of different wavelengths is, for example, thereby achieved. It is advantageous if the various photoinitiators are so chosen and are used in such a concentration that an identical optical absorption is produced with the emission lines used.

The invention accordingly relates also to a process for the polymerisation of the compositions according to the invention in which those compositions are irradiated with actinic light. The polymers obtained may be used, for example, as coating compositions, photoresists or adhesives.

It could not have been foreseen that it would be possible to manufacture from the compositions according to the invention, which comprise diacrylates having aromatic or cycloaliphatic groups in the above amounts, by stereolithographic processes, objects or shaped articles that have an extremely small curl (distortion phenomena), or a curl that cannot be measured, especially when specific ratios by weight of components C and D are used. Normally, when diacrylates are used without the substantial addition of acrylates of higher functionality, formulations are obtained that polymerise further after the exposure step and thus do not yield serviceable stereolithographically produced parts.

The invention relates also to a process for the manufacture of three-dimensional objects from a composition according to the invention by means of a lithographic process, especially a stereolithographic process, wherein the surface of a layer of the composition according to the invention, in its entirety or in a predetermined pattern, is irradiated with a UV/VIS light source so that a layer of a desired thickness solidifies in the irradiated areas and then a new layer of the composition according to the invention is formed on the solidified layer, the new layer likewise being irradiated over the entire surface or in a predetermined pattern, and, by repeated layering and irradiation, three-dimensional objects comprising several solidified layers adhering to one another are obtained.

In that process, a laser beam, which, in an especially preferred embodiment, is computer-controlled, is preferably used as the UV/VIS light source.

If the compositions according to the invention are used as coating compositions, then clear hard coatings are obtained on wood, paper, metal, ceramics or other surfaces. The coating thickness may vary greatly and is from approximately 1 μm to approximately 1 mm.

Relief images for printed circuits or printing plates can be produced directly from the mixtures according to the invention by irradiating the mixtures, for example by means of a computer-controlled laser beam of suitable wavelength or by using a photomask and a corresponding light source.

A further possible application is to use the compositions according to the invention as photocurable adhesives.

The compositions according to the invention are preferably used in the manufacture of photopolymerised layers, especially in the form of three-dimensional objects that are made up of several solidified layers adhering to one another.

The following Examples further illustrate the present invention.

EXAMPLE 1

64 g of 3,4-epoxycyclohexylmethyl-3',4'-epoxycyclohexanecarboxylate are mixed with 22 g of a trifunctional, OH-terminated polycaprolactone (TONE® Polyol 0301 manufactured by Union Carbide) and 12 g of bisphenol A diglycidyl ether diacrylate (Novacure® 3700 manufactured by Radcure) at 60° C. 1 g of 1-hydroxycyclohexyl phenyl ketone (Irgacure® 184 manufactured by Ciba-Geigy) and 1 g of triarylsulfonium hexafluoroantimonate (Cyracure® UVI 6974 manufactured by Union Carbide) are then added and the mixture is then stirred until a clear homogeneous mixture is formed. The liquid formulation has a viscosity of 618 mPa.s at 30° C. Shaped articles are manufactured using a He/Cd laser (irradiation energy: 40 mJ/cm$^2$). After laser curing (green models) those shaped articles have the following properties:

E-modulus: 1100 N/mm$^2$ (modulus of elasticity according to DIN 53371; green strength);

elongation at tear: 6.3%

(according to DIN 53455).

For full curing, the green models are irradiated with UV light for 30 minutes and heated at 130° C. for 30 minutes. The shaped articles then have the following properties:

E-modulus: 1450 N/mm$^2$ elongation at tear: 2.5% curl factor: CF 6: 0.01 CF 11: 0.02.

The curl factor is a known criterion in stereolithography for comparing the shrinkage phenomena of various mixtures with one another (see, for example, Proceedings 2$^{nd}$ Int. Conference in Rapid Prototyping, Dayton, Ohio (1991)). The indicated curl factors are determined using shaped articles that have been built up with a layer thickness of 0.076 mm.

EXAMPLE 2

55 g of 3,4-epoxycyclohexylmethyl-3',4'-epoxycyclohexanecarboxylate are mixed with 18 g of butanediol diglycidyl ether, 13 g of a trifunctional, OH-terminated polycaprolactone (TONE® Polyol 0301 manufactured by Union Carbide) and 12 g of ethoxylated bisphenol A diacrylate (SR® 349 manufactured by Sartomer) at 60° C. 1 g of 1-hydroxycyclohexyl phenyl ketone (Irgacure® 184 manufactured by Ciba-Geigy) and 1 g of triarylsulfonium hexafluoroantimonate (Cyracure® UVI 6974 manufactured by Union Carbide) are then added and the mixture is then stirred until a clear homogeneous mixture is formed. The liquid formulation has a viscosity of 138 mPa.s at 30° C. Shaped articles are manufactured using a He/Cd laser (irradiation energy: 320 mJ/cm$^2$). After laser curing (green models), those shaped articles have the following properties:

E-modulus: 1320 N/mm$^2$ elongation at tear: 6.4%

For full curing, the green models are irradiated with UV light for 30 minutes and heated at 130° C. for 30 minutes. The shaped articles then have the following properties:

E-modulus: 1580 N/mm$^2$ elongation at tear: 4.3% curl factor: CF 6: 0.01 CF 11: 0.02,

EXAMPLES 3–13

Formulations comprising the components indicated in Table 1 are prepared as in Example 1. The quantitative data are percentages by weight, calculated on the total weight of the corresponding formulation. The viscosities of those mixtures are also listed in Table 1. Shaped articles are manufactured using a He/Cd laser. The properties of the shaped articles obtained are indicated in Table 2.

TABLE 1

| Example | 3 | 4 | 5 | 6 | 7 | 8 | 9 | 10 | 11 | 12 | 13 |
|---|---|---|---|---|---|---|---|---|---|---|---|
| EP I[1] | 55 | 55 | 55 | 40 | 50 | 45 | 55.8 | 55.8 | 55.8 | 55.8 | 55.8 |
| EP II[1] | | | | 15 | | | | | | | |
| EP III[1] | 18 | 18 | 18 | 18 | 18 | 18 | 18 | 18 | 18 | 18 | 18 |
| Cyracure UVI 6974[2] | 1 | 1 | 1 | 1 | 1 | 1 | 0.6 | 0.6 | 0.6 | 0.6 | 0.6 |
| Diacrylate I[3] | | | | | | | 12 | | | | |
| Diacrylate II[3] | | | | | | | | 12 | | | |
| Diacrylate III[3] | | | | | | | | | 12 | | |

TABLE 1-continued

| Example | 3 | 4 | 5 | 6 | 7 | 8 | 9 | 10 | 11 | 12 | 13 |
|---|---|---|---|---|---|---|---|---|---|---|---|
| Diacrylate IV[3] | 12 | 12 | 12 | 12 | 17 | 22 | | | | 8 | 10 |
| SR 351[4] | | | | | | | | | | 4 | 2 |
| Irgacure 184[5] | 1 | 1 | 1 | 1 | 1 | 1 | 0.6 | 0.6 | 0.6 | 0.6 | 0.6 |
| TONE Polyol 0301[6] | 13 | | | 13 | 13 | 13 | 13 | 13 | 13 | 13 | 13 |
| Desmophen 1600[6] | | | 13 | | | | | | | | |
| Desmophen 1915[6] | | 13 | | | | | | | | | |
| Viscosity η (30° C.) | 182 | 262 | 166 | 199 | 237 | 309 | 190 | 172 | 153 | 139 | 153 |

[1] EP I (epoxy resin): 3,4-epoxycyclohexylmethyl-3',4'-epoxycyclohexanecarboxylate
  EP II (epoxy resin): di-(3,4-epoxycyclohexylmethyl)hexane dioate
  EP III (epoxy resin): 1,4-butanediol diglycidyl ether
[2] Cyracure UVI 6974: triarylsulfonium hexafluoroantimonate (Union Carbide)
[3] Diacrylate I:

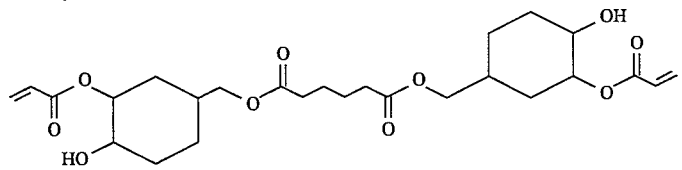

Diacrylate II:

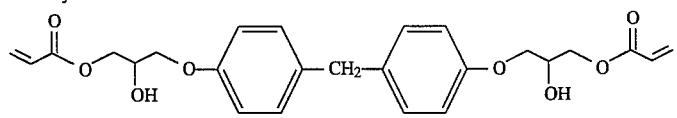

[3] Diacrylate III:

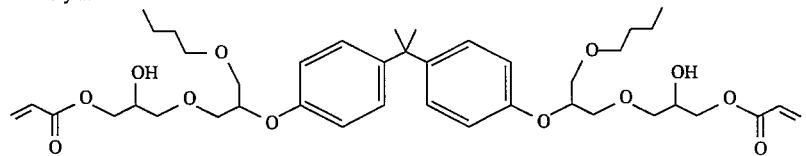

Diacrylate IV: bisphenol A diglycidyl ether diacrylate (Novacure 3700, Radcure)
[4] SR 351: trimethylolpropane triacrylate (Sartomer)
[5] Irgacure 184: 1-hydroxycyclohexyl phenyl ketone (Ciba-Geigy)
[6] TONE Polyol 0301: trifunctional, OH-terminated polycaprolactone (Union Carbide)
  Desmophen 1600: OH-terminated, linear polyether (Bayer)
  Desmophen 1915: branched polyether polyol (Bayer)

TABLE 2

| Example | 3 | 4 | 5 | 6 | 7 | 8 | 9 | 10 | 11 | 12 | 13 |
|---|---|---|---|---|---|---|---|---|---|---|---|
| irradiation energy [mJ/cm$^2$] | 80 | 160 | 160 | 80 | 40 | 40 | 160 | 160 | 160 | 160 | 160 |
| E-modul. [N/mm$^2$][2] | 464 | 101 | 764 | 962 | 710 | 795 | 1404 | 1026 | 691 | 874 | 991 |
| elong. at tear[%][2] | 11.7 | 10.8 | 12.6 | 17 | 39.6 | 38.9 | 17.6 | 51.8 | 11.4 | 8.6 | 9.7 |
| E-modul.[N/mm$^2$][3] | 1151 | 1022 | 1560 | 1139 | 1300 | 1344 | 1267 | 1611 | 1481 | 1673 | 1890 |
| elong. at tear[%][3] | 14.4 | 5.0 | 5.4 | 14.4 | 32.6 | 46.4 | 4.4 | 19.7 | 7.3 | 5.3 | 6.5 |
| CF 6[4] | 0.01 | −0.01 | 0 | −0.04 | −0.01 | −0.03 | −0.03 | −0.04 | −0.03 | −0.02 | 0 |
| CF 11[4] | 0 | 0.01 | 0 | 0 | 0.04 | 0.01 | −0.02 | 0 | −0.02 | 0.01 | −0.02 |

[2] values after laser curing at the irradiation energy indicated
[3] values after full curing (30 min UV, 30 min 130° C.)
[4] Curl factors (determined on shaped articles built up with layer thickness of 0.076 mm)

EXAMPLE 14

48.4 g of 3,4-epoxycyclohexylmethyl-3',4'-epoxycyclohexanecarboxylate are mixed with 18 g of butanediol diglycidyl ether, 20 g of a trifunctional, OH-terminated polycaprolactone (TONE® Polyol 0301 manufactured by Union Carbide), 8 g of bisphenol A diglycidyl ether diacrylate (Novacure® 3700 manufactured by Radcure) and 4 g of dipentaerythritol monohydroxypentaacrylate (SR® 399 manufactured by Sartomer) at 60° C. 0.8 g of 1-hydroxycyclohexyl phenyl ketone (Irgacure® 184 manufactured by Ciba-Geigy) and 0.8 g of triarylsulfonium hexafluoroantimonate (Cyracure® UVI 6974 manufactured by Union Carbide) are then added and the mixture is then stirred until a clear homogeneous mixture is formed. The liquid formulation has a viscosity of 194 mPa.s at 30° C. Shaped articles are manufactured using a He/Cd laser (irradiation energy: 160 mJ/cm$^2$). After laser curing (green models) those shaped articles have the following properties:

E-modulus: 55.4 N/mm$^2$ elongation at tear: 17%

For full curing, the green models are irradiated with UV light for 30 minutes and heated at 130° C. for 30 minutes. The shaped articles then have the following properties:

E-modulus: 2466 N/mm$^2$ elongation at tear: 11.2% curl factor: CF 6 weave*: −0.02,

*"6 weave" is determined on test specimens that are constructed with the "weave" structural form (see in this connection "Rapid Prototyping and Manufacturing, Fundamentals of Stereolithography, P. F. Jacobs ed., SME 1992, page 199 ff).

What is claimed is:

1. A photosensitive composition comprising
   A) from 40 to 80% by weight of at least one liquid epoxy resin having an epoxy functionality of equal to or greater than 2,
   B) from 0.1 to 10% by weight of at least one cationic photoinitiator for component A),
   C) from 5 to 40% by weight of at least one liquid cycloaliphatic or aromatic diacrylate,
   D) from 0 to 15% by weight of at least one liquid poly(meth-)acrylate having a (meth-)acrylate functionality of greater than 2, the proportion of component D) constituting a maximum of 50% by weight of the total (meth-)acrylate content,
   E) from 0.1 to 10% by weight of at least one radical photoinitiator for component C) and, where appropriate, component D) and
   F) from 5 to 40% by weight of at least one OH-terminated polyether, polyester or polyurethane.

2. A photosensitive composition according to claim 1 wherein the proportion of component D) constitutes a maximum of 40% by weight of the total (meth)acrylate content.

3. A photosensitive composition according to claim 1 comprising
   A) from 50 to 75% by weight of at least one liquid epoxy resin having an epoxy functionality of equal to or greater than 2,
   B) from 0.2 to 5% by weight of at least one cationic photoinitiator for component A),
   C) from 5 to 20% by weight of at least one liquid cycloaliphatic or aromatic diacrylate,
   D) from 0 to 10% by weight of at least one liquid polyacrylate having an acrylate functionality of greater than 2, the proportion of component D) constituting a maximum of 50% by weight of the total acrylate content,
   E) from 0.2 to 5% by weight of at least one radical photoinitiator for component C) and, where appropriate, component D) and
   F) from 10 to 40% by weight of at least one OH-terminated polyether, polyester or polyurethane.

4. A photosensitive composition according to claim 1 wherein component A) comprises at least 50% by weight of a cycloaliphatic diepoxide.

5. A photosensitive composition according to claim 4 wherein the cycloaliphatic diepoxide is bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexanecarboxylate, 3,4-epoxy-6-methyl-cyclohexylmethyl-3,4-epoxy-6-methylcyclohexanecarboxylate, di-(3,4-epoxycyclohexylmethyl)hexanedioate, di-(3,4-epoxy-6-methyl-cyclohexylmethyl)hexanedioate, ethylenebis(3,4-epoxycyclohexanecarboxylate), ethanediol di-(3,4-epoxycyclohexylmethyl)ether or 2-(3,4-epoxycyclohexyl-5,5-spiro-3,4-epoxy)cyclohexane-1,3-dioxane.

6. A photosensitive composition according to claim 1 comprising as component B) a compound of the formula I, II or III

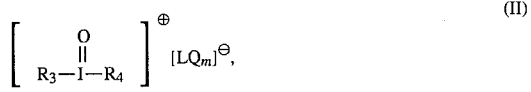

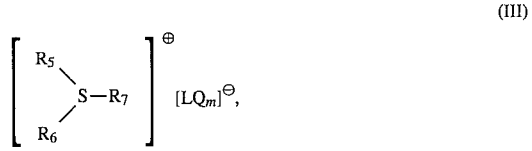

wherein $R_1$, $R_2$, $R_3$, $R_4$, $R_5$, $R_6$ and $R_7$ are each independently of the others $C_6$–$C_{18}$aryl that is unsubstituted or substituted by suitable radicals, L is boron, phosphorus, arsenic or antimony, Q is a halogen atom or some of the radicals Q in an anion $LQ_m^-$ may also be hydroxy groups, and m is an integer that corresponds to the valency of L plus 1.

7. A photosensitive composition according to claim 1 comprising as component B) a compound of formula IV

wherein c is 1 or 2, d is 1, 2, 3, 4 or 5,

X is a non-nucleophilic anion, especially $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, n-$C_6F_{13}SO_3^-$ or n-$C_8F_{17}SO_3^-$, $R_8$ is a π-arene and $R_9$ is an anion of a π-arene, especially a cyclopentadienyl anion.

8. A photosensitive composition according to claim 6 comprising as component B) a compound of formula III wherein $R_5$, $R_6$ and $R_7$ are aryl.

9. A photosensitive composition according to claim 1 comprising as component C) a compound of formula V, VI, VII or VIII

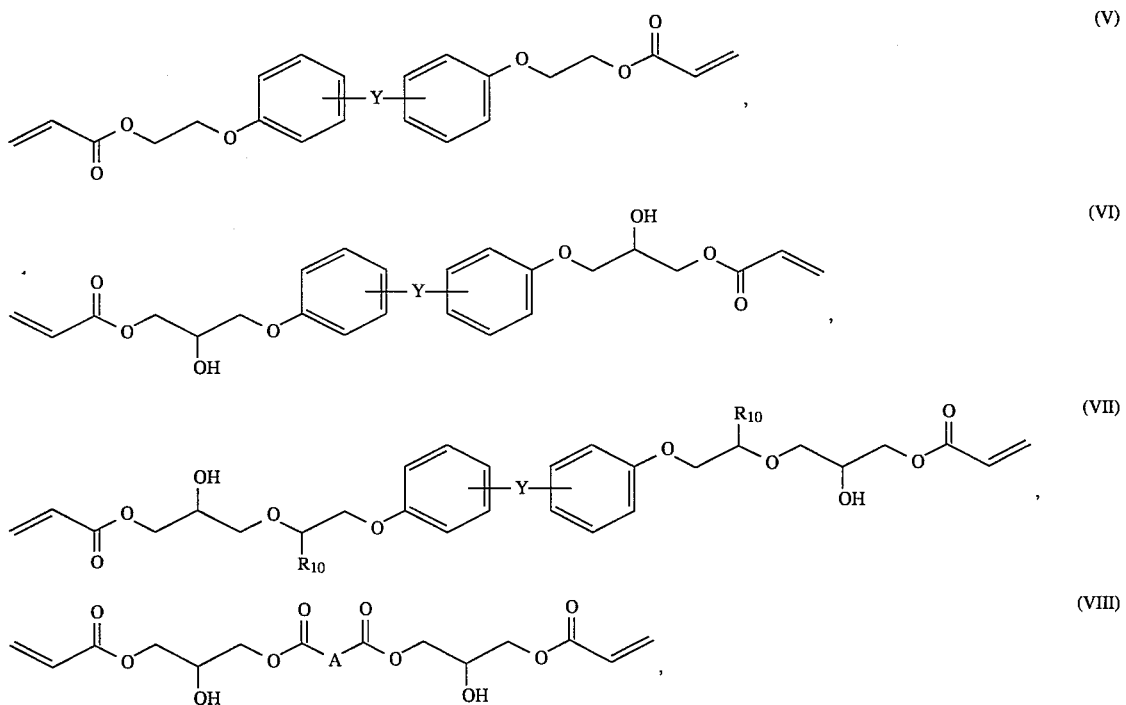

wherein
Y is a direct bond, $C_1$–$C_6$alkylene, —S—, —O—, —SO—, —SO$_2$— or —CO—, $R_{10}$ is a $C_1$–$C_8$alkyl group, a phenyl group that is unsubstituted or substituted by one or more $C_1$–$C_4$alkyl groups, hydroxy groups or halogen atoms, or a radical of the formula —CH$_2$—OR$_{11}$, wherein $R_{11}$ is a $C_1$–$C_8$alkyl group or a phenyl group, and A is a radical of the formula

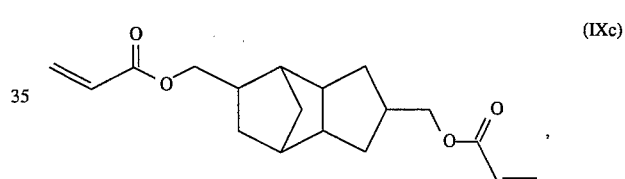

or comprising as component C) a compound of any one of formulae IXa to IXd and the corresponding isomers,

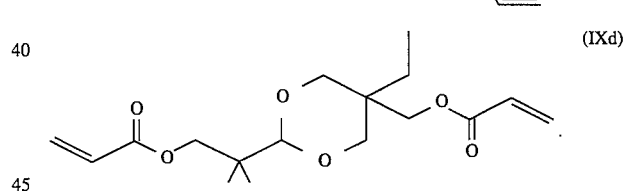

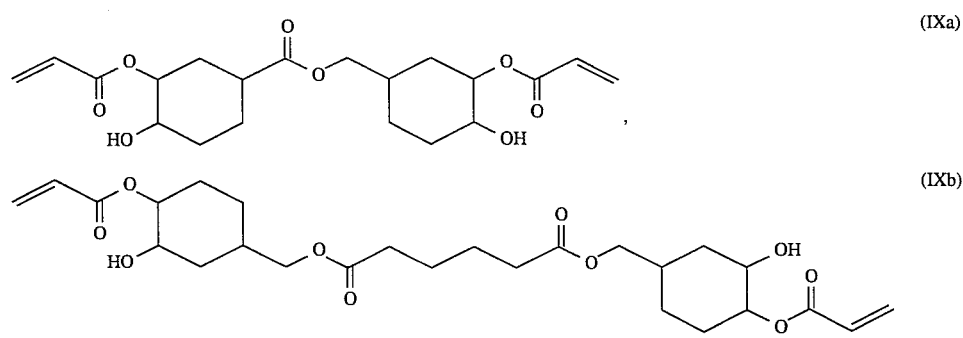

10. A photosensitive composition according to claim 9 wherein in formula V, VI or VII Y as alkylene is —CH$_2$— or —C(CH$_3$)$_2$—.

11. A photosensitive composition according to claim 9 wherein in formula VII $R_{10}$ is n-butyl, phenyl, n-butoxymethyl or phenoxymethyl.

12. A photosensitive composition according to claim 1 wherein component D) is a tri(meth-)acrylate or a penta(meth-)acrylate.

13. A photosensitive composition according to claim 12 wherein the penta(meth-)acrylate is dipentaerythritol monohydroxypenta(meth-)acrylate.

14. A photosensitive composition according to claim 1 comprising as component E) a 1-hydroxyphenyl ketone.

15. A photosensitive composition according to claim 14 wherein the 1-hydroxyphenyl ketone is 1-hydroxycyclohexyl phenyl ketone.

16. A photosensitive composition according to claim 1 comprising as component F) a linear or branched polyester polyol.

17. A photosensitive composition according to claim 1 comprising as component F) a trifunctional, OH-terminated polycaprolactone.

18. A photosensitive composition according to claim 1 comprising as component A) a cycloaliphatic diepoxide and an aliphatic polyglycidyl ether, as component B) triarylsulfonium hexafluoroantimonate, as component C) a compound of formula VI wherein Y is $-CH_2-$ or $-C(CH_3)_2-$, as component D) a tri(meth-)acrylate or a penta(meth-)acrylate, as component E) a 1-hydroxyphenyl ketone and as component F) a linear or branched polyester polyol.

19. A process for polymerising the composition according to claim 1 by irradiating it with actinic light.

20. A process for the manufacture of three-dimensional objects from a composition according to claim 1 by means of a lithographic process, wherein the surface of a layer of the said composition, in its entirety or in a predetermined pattern, is irradiated with a UV/VIS light source so that a layer of a desired thickness solidifies in the irradiated areas and then a new layer of that composition is formed on the solidified layer, the new layer likewise being irradiated over the entire surface or in a predetermined pattern, and, by repeated layering and irradiation, three-dimensional objects comprising several solidified layers adhering to one another are obtained.

21. A process according to claim 20, wherein the UV/VIS light source is a laser beam, preferably a computer-controlled laser beam.

22. The use of a composition according to claim 1 in the manufacture of photopolymerised layers, especially in the form of three-dimensional objects that are made up of several solidified layers adhering to one another.

* * * * *